United States Patent [19]

Hsu

[11] Patent Number: 4,512,073

[45] Date of Patent: Apr. 23, 1985

[54] METHOD OF FORMING SELF-ALIGNED CONTACT OPENINGS

[75] Inventor: Sheng T. Hsu, Lawrenceville, N.J.

[73] Assignee: RCA Corporation, Princeton, N.J.

[21] Appl. No.: 582,752

[22] Filed: Feb. 23, 1984

[51] Int. Cl.³ .................... H01L 21/265; H01L 21/28
[52] U.S. Cl. .................................. 29/571; 29/576 B; 29/578; 29/579; 29/589; 148/1.5; 148/187; 148/188; 357/41; 357/44; 357/59; 357/65
[58] Field of Search ............... 29/571, 576 R, 576 W, 29/578, 580, 579, 591; 148/1.5, 187, 188; 357/41, 44, 59, 65

[56] References Cited

U.S. PATENT DOCUMENTS

| 4,063,973 | 12/1977 | Kirita et al. | 148/188 |
|---|---|---|---|
| 4,114,256 | 9/1978 | Thibault et al. | 29/571 |
| 4,124,934 | 11/1978 | De Brébisson | 148/188 X |
| 4,151,631 | 5/1979 | Klein | 148/188 X |
| 4,196,443 | 4/1980 | Dingwall | 357/68 |
| 4,231,820 | 11/1980 | Henry | 148/188 X |
| 4,304,042 | 12/1981 | Yeh | 29/576 B X |
| 4,371,403 | 2/1983 | Ikubo et al. | 29/571 X |
| 4,373,254 | 2/1983 | Blumenfeld | 29/578 |
| 4,404,733 | 9/1983 | Sasaki | 29/571 |
| 4,406,710 | 9/1983 | Davies et al. | 29/576 B X |
| 4,433,468 | 2/1984 | Kawamata | 148/188 X |

OTHER PUBLICATIONS

"Reactive Sputter Etching of Dielectrics", M. T. Duffy, et al., RCA Review, vol. 44, Mar. 1983, pp. 157–168.

Primary Examiner—Brian E. Hearn
Assistant Examiner—David A. Hey
Attorney, Agent, or Firm—Birgit E. Morris; Donald S. Cohen; Lawrence P. Benjamin

[57] ABSTRACT

A process for forming reliable contacts in a VLSI device wherein, after the source and drain regions have been formed, the contact openings are formed and the source and drain regions redoped. A heat treatment step anneals surface damage and causes lateral migration of the implanted ions to preclude the contact from forming a short circuit between the doped region and the substrate exposed as a result of any misalignment of the contact openings. As an added benefit, the process also prevents the contact from "spiking" through the doped region to the underlying substrate.

6 Claims, 5 Drawing Figures

METHOD OF FORMING SELF-ALIGNED CONTACT OPENINGS

BACKGROUND OF THE INVENTION

This invention relates, in general, to semi-conductor processing and more particularly to a novel method of reliably forming self-aligned contact openings, the method having particular utility in the processing of Very Large Scale Integrated Circuit (VLSIC) devices.

One of the major factors affecting the field of high density integrated circuits (IC) has been the accuracy of alignment of the apertures in the various layers of photoresist both with respect to the direct connections to doped semi-conductor regions, as well as level-to-level alignment for interlevel connections. This problem becomes more troublesome as the density of the IC devices, on a given size chip, and the geometries (gate, drain, and source dimensions) of each device becomes smaller.

One approach toward a solution to this problem appears in a recently issued patent to A. G. F. Dingwall, entitled "BURIED CONTACT CONFIGURATION FOR CMOS/SOS INTEGRATED CIRCUITS", U.S. Pat. No. 4,196,443 ('443) which issued on Apr. 1, 1980 and is assigned to the same assignee as the subject application. In this '443 patent there is described various configurations for buried contact openings that have been formed in the insulating layer overlying a layer of semi-conductor material and through which the buried contact is made. The philosophy behind the '443 patent is to form the opening of the buried contact in a manner so as to preclude the complete removal of the epitaxial silicon material in the event of a major misalignment. Thus, the configuration of the described opening is designed to ensure sufficient contact to the desired area and sufficient silicon to surround the contact region to form a useful device. However, it must be recognized that the '443 patent does not eliminate the removal of epitaxial silicon in the event of a misalignment.

To preclude the inadvertent removal of epitaxial silicon one would look to a recent patent which issued in the name of Martin A. Blumenfeld entitled "METHOD OF FABRICATING BURIED CONTACTS", U.S. Pat. No. 4,373,254 ('254) which issued on Feb. 15, 1983 and is assigned to the same assignee as the subject application. The philosophy behind the process of the '254 patent is to precondition an area surrounding the buried contact by doping. Thereafter, the contact opening is made smaller than the preconditioned area and the '254 process does not have to pay the penalty of forming an undesired junction thus rendering the device inoperative. However, while not having to pay certain penalties, the art would not look to either the '254 or the '443 patents for a solution to the misalignment in a VLSI circuit device due to the fact that the designer does not have the luxury of forming excessively broad protective bands, as suggested by the '254 process. Similarly, it would not be feasible to look to the '443 process due to the fact that this process does not address the problem of conservation of "real estate" where chip area is so valuable.

SUMMARY OF THE INVENTION

A novel process is described for forming contact openings wherein the exposed epitaxial silicon is initially provided with source and drain regions and thereafter, after the contact openings are formed, the source and drain regions are doped again. After an appropriate heat treatment, the resultant lateral dispersion of the implanted ions will preclude the contact from forming a short circuit between the doped region and the substrate and also provide means for preventing the "spiking" of the metal contact through the doped region (source or drain) into the substrate.

DETAIL DESCRIPTION OF THE DRAWING

Figure 1:
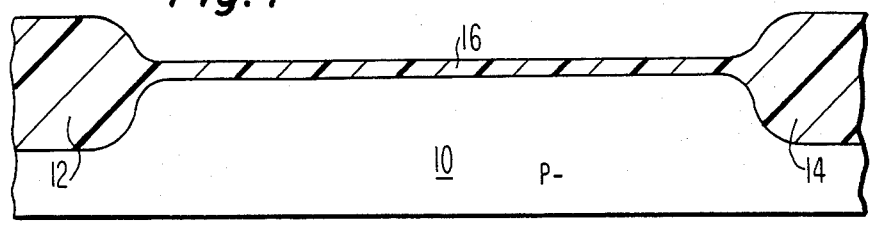
FIGS. 1-5 represent elevational views, respectively, of the process of the subject invention indicating the various stages of the novel method.

Referring now to FIG. 1, there is shown a substrate 10 of a P-type conductivity with field oxide regions 12 and 14 grown therein. These field oxide regions 12 and 14 have been grown in a well known manner by providing the surface of substrate 10 with an apertured, non-oxidizable layer such as silicon nitride (not shown) and thereafter oxidizing the exposed portions of the substrate. Thereafter, layer 16 is formed of a dense oxide which will be used as the gate oxide. Generally, this may be thermally grown or may be a Chemically Vapor Deposited (CVD) to a thickness of about 0.025 microns.

Figure 2:
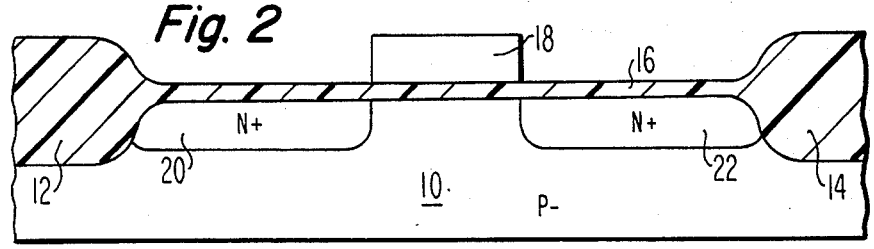

Thereafter, as shown in FIG. 2, a polycrystalline silicon (polysilicon) gate member 18 is formed on the surface of oxide layer 16 by depositing a layer of polysilicon and masking and etching the layer, as is well known. Using a self-aligned process, drain 20 and source 22 are formed at the upper surface of substrate 10. It should be understood that this process is particularly useful in the fabrication of a high density or VLSI device wherein the junction depth of either the source or drain region can be no deeper than about 0.5 microns and where the width of each region can be as small as about 1 to 2 microns. Source and drain regions 20 and 22 may be formed by either ion implantation or by diffusion, either process being well known in the art.

Figure 3:
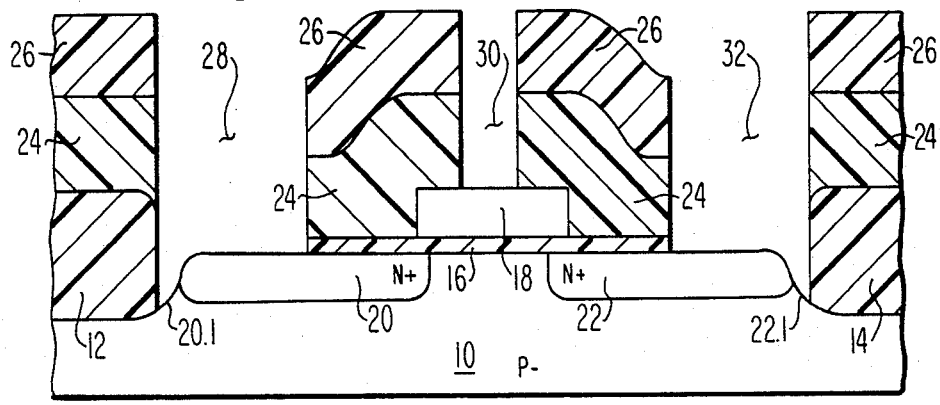

Referring now to FIG. 3, it will be seen that after regions 20 and 21 have been formed, the structure is provided with a layer 24 of silicon dioxide which may, for example, be a CVD oxide. This is followed by a layer of apertured photoresist 26 in order to form contact openings 28, 30 and 32. Contact openings 28, 30, and 32 are formed by subjecting the structure to a plasma etch (not shown) in order to form the contact openings. It should be understood that the N+ regions 20 and 22 are of a minimum dimension, which makes it almost impossible to form accurately placed minimum contact openings. Accordingly, when openings 28 and 30 for the source and drain have been made, region 20.1 adjacent source region 20, and region 22.1 adjacent drain region 22 are exposed portions of substrate 10. Should a metal contact be deposited in openings 28 and 32, it would thus become obvious that it would short circuit the junction and render both the source and drain unuseable. It should be noted at this point that the reason for the presence of exposed substrate 20.1 and 22.1 resides in the fact that a highly selective and anisotropic dry etch process has been used in which the etch is performed in a $CHF_3+H_2$ gas mixture in a parallel-plate reactor as described by M. T. Duffy, et al., in an article entitled "REACTIVE SPUTTER ETCHING OF DIELECTRICS", RCA Review, Vol. 44, March, 1983, pp. 157-168. By varying the amount of hydrogren used in the plasma, a high degree of selectivity can be achieved in cases where the dielectric material is over-etched, without attacking the silicon substrate in the contact opening.

Figure 4:
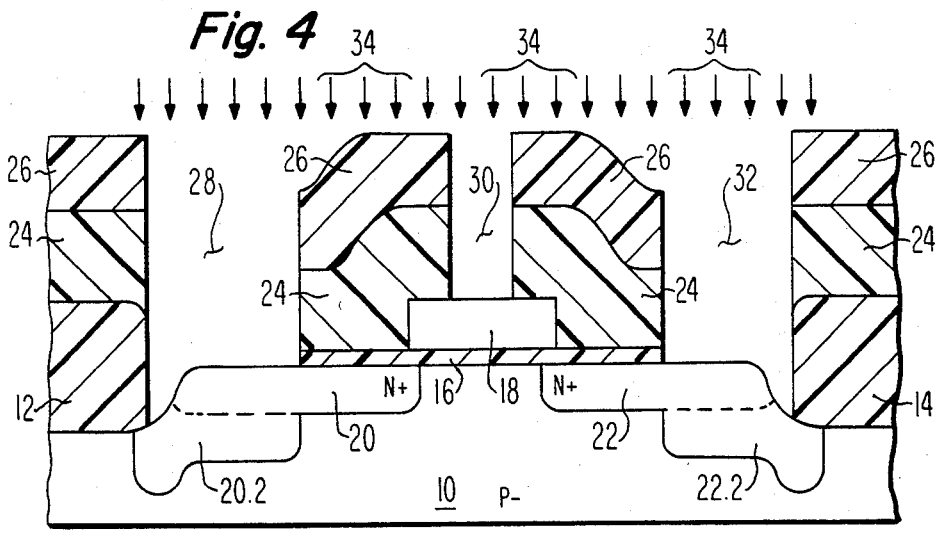

Having accomplished the etched configuration, reference is now made to FIG. 4 where the structure is shown being subjected to an ion implantation step where, for example, phosphorous is implanted, as shown symbolically by arrows 34, to form regions 20.2 and 22.2. This may be done at an average energy level of about 150 KeV. Thereafter, the structure is heated to a temperature of about 950 degrees C. for a period of about 30 minutes which serves to anneal any surface damage caused by the ion implantation and to form the deep implant portions regions 20.2 and 22.2. The heating of the structure also causes the lateral channeling or migration of the implanted impurities, which extends the N+ regions 20.2 and 22.2 under field oxide regions 12 and 14 respectively, while simultaneously causing the 20 and 22 portions of the N+ regions to extend slightly under gate member 18.

Figure 5:
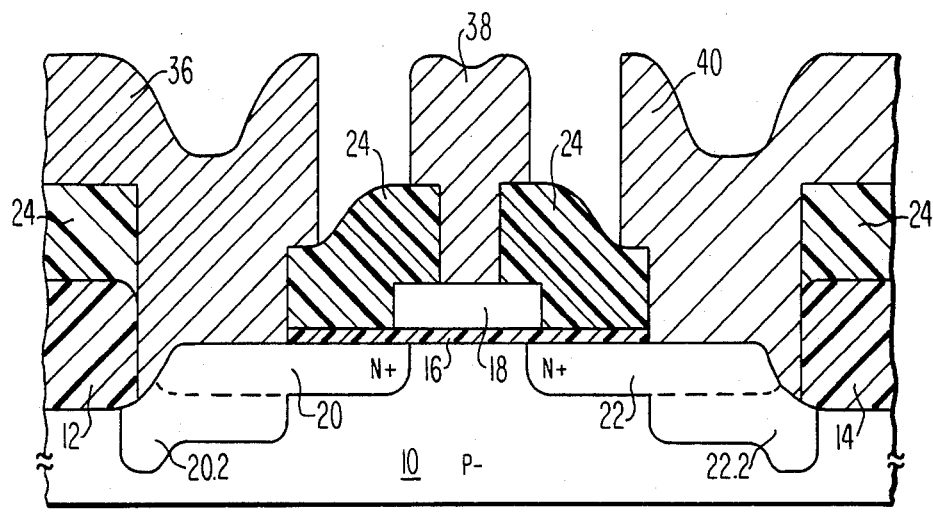

Thereafter, as shown in FIG. 5, the photoresist layer 26 is removed and a layer of aluminum and 1 percent silicon alloy is deposited, masked and etched to form contacts 36, 38, and 40. As the next step, the device is heated to sinter the aluminum-silicon metal alloy contact material and, as a final step, a protective layer of a borophosphosilicate glass (not shown) may be provided as a protective overcoat to prevent oxidation and the resultant deterioration of the aluminum-silicon metal alloy layer.

Thus, I have provided a process for opening contact holes over a minimum size doped region in order to metallize region without shorting to or spiking through to the substrate while conserving valuable chip area by using the contact opening mask as an implantation mask.

What I claim is:

1. In a process for forming a self-aligned contact opening in a semiconductor device, the device having a semiconductor substrate of a first conductivity type, a gate insulator layer formed on the surface of the substrate, a gate member formed on a portion of the surface of the insulator layer, a source region and a drain region of a second opposite conductivity type formed in the substrate at the surface thereof and having their facing edges aligned with the edges of the gate member, the gate member and the remainder of the gate insulator layer being covered with a second insulator layer, the improved process comprising the following steps, in the following order:

forming openings in the second insulator layer and in the gate insulator layer to expose a portion of the source region, a portion of the drain region and a portion of the gate member, wherein, after etching, any misalignment of the apertures, with respect to the source and drain regions, exposes portions of the substrate adjacent the source and/or drain regions;

implanting a second type conductivity modifier through the apertures into the source and drain regions and into any exposed area of substrate;

heating the substrate to anneal implantation damage and to cause the implanted conductivity modifiers to migrate laterally and deeper into the substrate; and depositing conductive material into the apertures to form ohmic contacts with the source and drain regions, the gate member and any previously exposed area of substrate.

2. The process of claim 1, comprising the further step of:

prior to the step of forming openings, forming an apertured layer of photoresist on the second insulator layer with the apertures thereof in approximate alignment with the source region, the drain region and the gate member respectively.

3. The process of claim 2, comprising the further step of:

removing the layer of photoresist prior to heating the substrate to anneal implantation damage.

4. The process of claim 3, wherein:
the source and drain regions are formed in the substrate to a depth not exceeding about 0.5 microns.

5. The process of claim 4, wherein:
the second type conductivity modifiers are implanted into the source and drain regions and into any exposed substrate at an average energy level of about 150 KeV; and
the implanted surface is annealed at a temperature of about 950 degrees C. for a period of about 30 minutes.

6. The process of claim 5, comprising the further steps of:

providing the substrate with a plurality of source and drain region pairs and associated gate members; and forming the apertures of the layer of apertured photoresist in substantial alignment with the source and drain regions and gate member of each source and drain region pair.

* * * * *